(12) United States Patent
Zhang et al.

(10) Patent No.: US 11,682,969 B2
(45) Date of Patent: Jun. 20, 2023

(54) VOLTAGE REGULATOR WITH ON-TIME EXTENSION

(71) Applicant: TEXAS INSTRUMENTS INCORPORATED, Dallas, TX (US)

(72) Inventors: Liang Zhang, Beijing (CN); Guoyang Wu, Beijing (CN); Weibing Jing, Beijing (CN); Dan Li, Beijing (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 263 days.

(21) Appl. No.: 17/110,504

(22) Filed: Dec. 3, 2020

(65) Prior Publication Data

US 2021/0184573 A1 Jun. 17, 2021

Related U.S. Application Data

(60) Provisional application No. 62/948,040, filed on Dec. 13, 2019.

(51) Int. Cl.
*H02M 3/158* (2006.01)
*H02M 1/14* (2006.01)
*H03K 5/00* (2006.01)

(52) U.S. Cl.
CPC ............ *H02M 3/158* (2013.01); *H02M 1/14* (2013.01); *H03K 2005/00078* (2013.01)

(58) Field of Classification Search
CPC ............ H02M 3/155–1588; H03K 2005/0078
See application file for complete search history.

(56) References Cited

U.S. PATENT DOCUMENTS

| | | | | |
|---|---|---|---|---|
| 6,212,079 | B1 * | 4/2001 | Balakrishnan .... | H02M 3/33507 323/284 |
| 2008/0088292 | A1 * | 4/2008 | Stoichita ............... | H02M 3/156 323/285 |
| 2015/0280556 | A1 * | 10/2015 | Bari ........................ | H02M 1/14 323/282 |
| 2017/0346400 | A1 * | 11/2017 | Li ....................... | H02M 3/1582 |

* cited by examiner

*Primary Examiner* — Peter M Novak
(74) *Attorney, Agent, or Firm* — Charles F. Koch; Frank D. Cimino

(57) ABSTRACT

A voltage regulator circuit includes a high side (HS) transistor having a control input and a low side (LS) transistor having a control input. The LS transistor is coupled to the HS transistor at a switching terminal. A comparator has first and second inputs and an output. A first resistor is coupled to the switching terminal. A second resistor is coupled between the first resistor and the second input of the comparator. A capacitor is coupled between a second resistor terminal of the second resistor and ground. A switch has first and second switch terminals and a control input. The first switch terminal is coupled to the first resistor terminal of the second resistor, and the second switch terminal is coupled to the second resistor terminal. A delay circuit has an input and an output. The output of the delay circuit is coupled to the control input of the switch.

18 Claims, 5 Drawing Sheets

VOLTAGE REGULATOR WITH ON-TIME EXTENSION

CROSS REFERENCE TO RELATED APPLICATION

This application claims priority to U.S. Provisional Application 62/948,040, filed Dec. 13, 2019, titled "DCDC Converter with On-Time Extension (OTE) Circuit," which is hereby incorporated by reference in its entirety.

BACKGROUND

A direct current (DC)-to-DC switching voltage regulator may include a high side (HS) transistor coupled to a low side (LS) transistor. The DC-to-DC voltage regulator may also include a control circuit that turns on and off the HS and LS transistors to produce a target output voltage on the output of the regulator. Various control techniques can be employed to control the operation of the HS and LS transistors. In one example, the control technique implements a fixed on-time control for the HS transistor-so in each cycle, the HS transistor is turned on for a fixed period of time. To regulate the level of the output voltage for a range of possible input voltages, the off-time of the HS transistor (during which the LS transistor is turned on) can be varied, thereby varying the duty cycle (i.e., the percentage of the time that the HS transistor is on in each cycle). At lower levels of input voltage (which may occur if the input voltage is supplied by a battery whose charge is depleting), a fixed on-time control circuit responds by increasing the duty cycle.

SUMMARY

In one example, a voltage regulator circuit includes a high side (HS) transistor having a control input and a low side (LS) transistor having a control input. The LS transistor is coupled to the HS transistor at a switch terminal. A comparator has first and second inputs and an output. A first resistor is coupled to the switch terminal. A second resistor is coupled between the first resistor and the second input of the comparator. A capacitor is coupled between a second resistor terminal of the second resistor and ground. A switch has first and second switch terminals and a control input. The first switch terminal is coupled to the first resistor terminal of the second resistor, and the second switch terminal is coupled to the second resistor terminal. A delay circuit has an input and an output. The output of the delay circuit is coupled to the control input of the switch.

DETAILED DESCRIPTION

For a fixed on-time control technique for a switching voltage regulator, the duty cycle increases as described above responsive to decreases in the input voltage. The on-time of the HS transistor remains constant, but the off-time decreases thereby resulting in a higher duty cycle. However, there is an upper limit on the duty cycle, and further accommodations to even lower input voltages are not possible. Further, sudden increases in load (e.g., a few milliamperes (mA) of load current jumping to 6 amperes (A) of current when the input voltage is near the output voltage) can result in large drop in the output voltage (referred to as "undershoot"). The examples described herein include a control circuit for a switching DC-to-DC voltage regulator that includes an on-time extension circuit which lengths the otherwise fixed on-time for the HS transistor responsive to periods of time characterized by levels of output voltage undershoot in excess of a threshold amount. By extending the on-time, the load current is able to step up from a low level to a higher level in fewer switching cycles than would otherwise have been the case if the on-time was not extended. As a result, the magnitude of the undershoot is reduced. Further, the duty cycle can achieve a higher level than if the on-time extension capability was absent.

Figure 1:
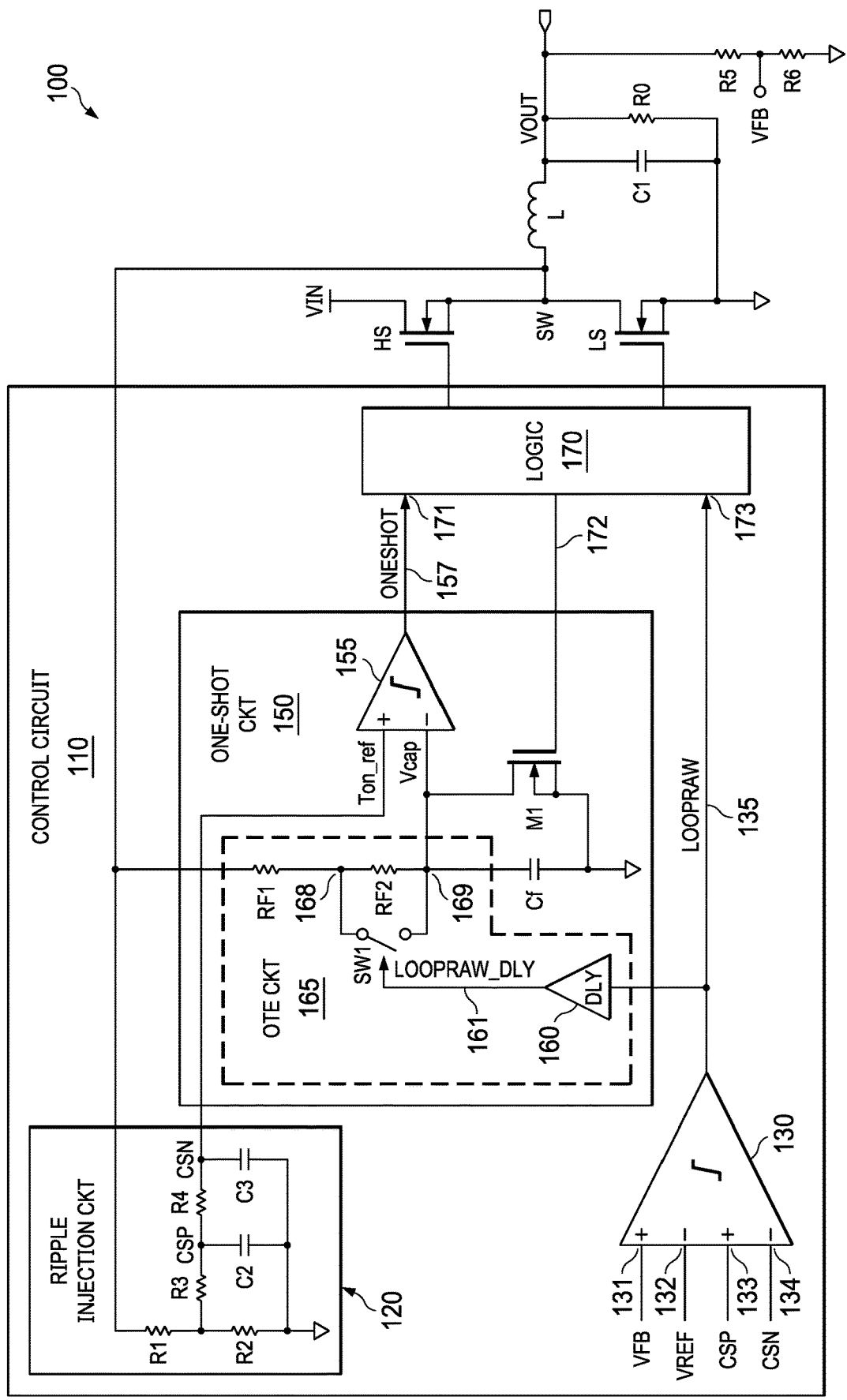
FIG. 1 illustrates a voltage regulator employing on-time extension for a high side transistor.

FIG. 1 shows an example of a voltage regulator 100 that includes a control circuit 110 coupled to a high side (HS) transistor and a low side (LS) transistor. The HS and LS transistors in this example are n-type metal oxide semiconductor field effect transistors (NMOS). The drain of the HS transistor is connected to the supply voltage rail (VIN), and the source of the HS transistor is coupled to the drain of the LS transistor. The connection between the HS and LS transistors is referred to as the switching node (SW). The source of the LS transistor is connected to ground. SW is connected to one terminal of inductor L, and the other terminal of inductor L is connected to capacitor C1 and an output resistor R0 at an output node identified as VOUT (VOUT also refers to the output voltage on the node). The logic 170 of the control circuit 110 controls the on and off state of the HS and LS transistors so as to regulate the output voltage (VOUT) to a prescribed level despite the input voltage (VIN) being any voltage within a range of possible input voltages. For example, VOUT may be 5V while VIN is a voltage in the range of 7.4V to 8.4V. When logic 170 turns on the HS transistor (with the LS transistor being off), the voltage on SW is approximately equal to VIN (VIN less the drain-to-source voltage drop of the HS transistor). When logic 170 turns the LS transistor on (and the HS transistor is off), the voltage on SW is approximately equal to ground. Thus, the voltage on SW toggles between VIN and ground.

A resistor divider comprising resistors R5 and R6 produces a scaled version of VOUT, which is a feedback voltage (VFB) provided to the control circuit 110. The control circuit 110 includes a ripple injection circuit 120, a summing comparator 130, a one-shot circuit 150, and logic 170. The ripple injection circuit 120 includes resistors R1-R4, and capacitors C2 and C3. Resistor R1 is connected to SW, and thus receives VIN when the HS transistor is on. R2 is connected between R1 and ground. R3 is connected to R1 and R2 as shown. R3 and R4 are connected together at a node labeled CSP. C2 is connected between CSP and ground. R4 and C3 are connected in series between CSP and ground, with the node between R4 and C3 designated as CSN.

Ripple injection is implemented by the ripple injection circuit and is used for loop compensation (CSP and CSN) and the generation of the TON_REF signal on CSN to control the on-time of the HS transistor. The combination of R4 and C3 implements a low-pass filter. Per the low-pass filtering function performed by R4 and C3, TON_REF is a direct current (DC) signal whose voltage level is a scaled version of the average signal level on the SW node when the HS transistor is on. The voltage on the SW node is approximately equal to VIN and thus TON_REF is scaled approximation of VIN. TON_REF=(VIN/N)*Duty Cycle, which equals VOUT/N, where N=(R1+R2)/R2.

The one-shot circuit 150 includes a comparator 155, resistor RF1, capacitor CF, transistor M1, and on-time extension (OTE) circuit 165. OTE circuit 165 includes resistor RF2, switch SW1 (which may comprise a transistor), and delay circuit 160. RF2, switch SW1, and delay circuit RF1, RF2, and CF are connected in series between SW and ground. The terminals of RF2 are labeled 168 and 169. Switch SW1 connects to terminals 168 and 169 of RF2. Accordingly, RF2 is shorted by SW1 when SW1 is closed (on). The delay circuit 160 has an output that is coupled to and provides a control signal to control the open/closed state of switch SW1. M1 is connected across capacitor CF with the drain of CF connected to terminal 169 and the source of M1 connected to ground. Terminal 169 (node between capacitor CF and resistor RF2) is connected to the negative input of comparator 155. The signal on terminal 169 is labeled VCAP. The positive input of comparator 155 is connected to CSN and thus receives TON_REF. The output of comparator 155 provides a signal labeled ONESHOT 157, which is provided to a control input 171 of logic 170.

The summing comparator 130 includes two pairs of inputs, each pair including a positive input and a negative input. The feedback signal, VFB, is provided to positive input 131. A reference voltage, VREF, is provided to negative input 132. CSP and CSN are provided to inputs 133 and 134, respectively. The summing comparator 130 generates an output signal labeled LOOPRAW. LOOPRAW is asserted high when VFB+CSN is higher than VREF+CSN and is forced low when VFB is lower than VREF. LOOPRAW is provided to another control input 173 of logic 170

As will be described below, logic 170 control the on and off state of the HS and LS transistors based on its control input signals, LOOPRAW 135 and ONESHOT 157. In one example, logic 170 is a digital circuit that is synthesized using a synthesization tool based on the functionality described herein.

Figure 2:
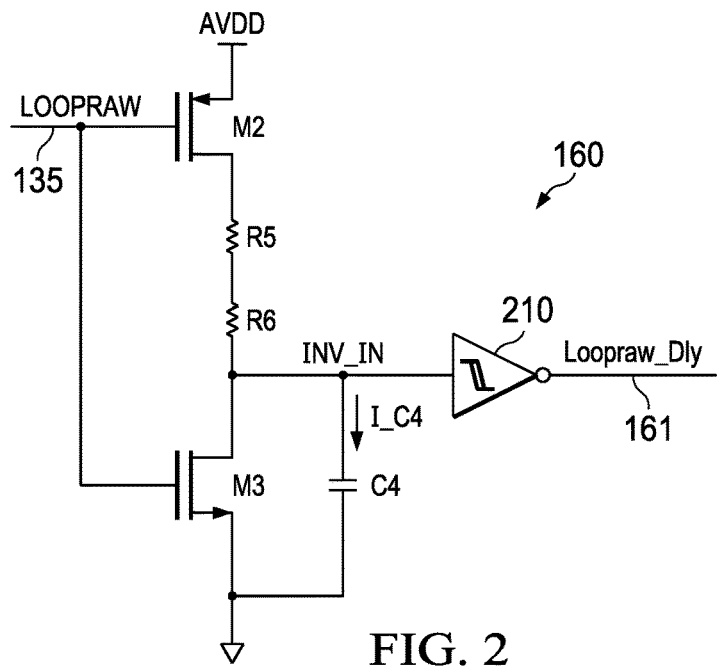
FIG. 2 shows an example implementation of a delay circuit in the voltage regulator.

FIG. 2 shows an example implementation of delay circuit 160. In this example, delay circuit 160 includes transistors M2 and M3, resistors R5 and R6, capacitor C4, and an inverter 210. M2 is a p-type metal oxide semiconductor field effect transistor (PMOS) and M3 is an NMOS transistor. The source of M2 is connected to a supply voltage rail (AVDD). Resistors R5 and R6 are connected in series between the drains of M2 and M3. The source of M3 is connected to ground. The gates of M2 and M3 are connected together and receive LOOPRAW. The drain of M3 is connected to the input of inverter 210. The inverter's output generates a signal called LOOPRAW_DLY 161, which as shown in FIG. 1 is used to control switch SW1. In one example, switch SW1 is on (closed) responsive to LOOPRAW_DLY 161 being logic high and is off (open) responsive to LOOPRAW_DLY being logic low. Capacitor C4 is connected across the drain and source of M3 as shown.

Figure 3:
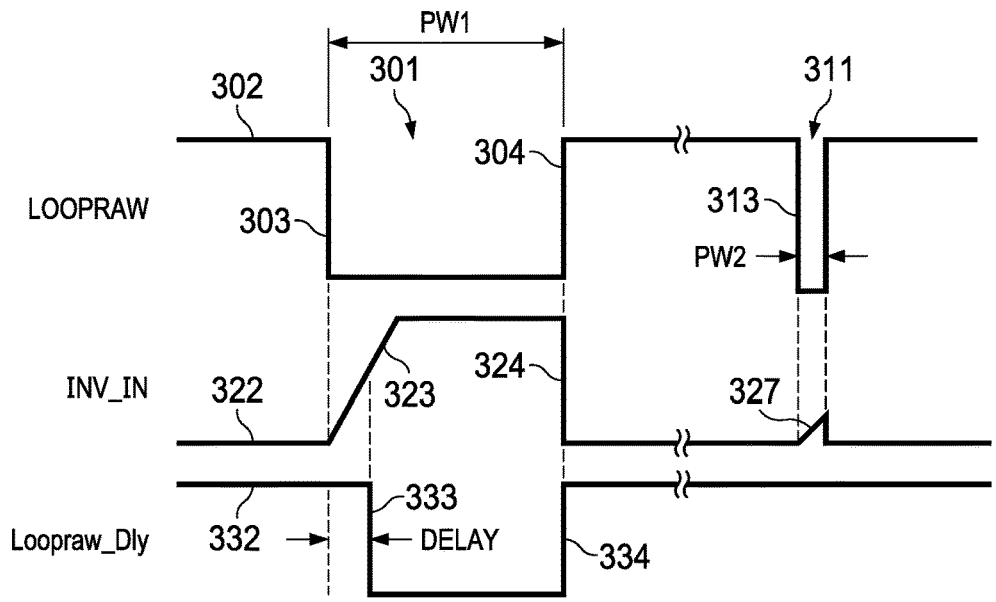
FIG. 3 shows a timing diagram illustrating the operation of the delay circuit of FIG. 2.

FIG. 3 provides a timing diagram illustrating the operation of delay circuit 160. The input signal to the delay circuit 160 is LOOPRAW, and the output signal is LOOPRAW_DLY. The output voltage VOUT from the voltage regulator 100 increases when the HS transistor is on and decreases when the LS transistor is on. LOOPRAW has a negative pulse as shown at 301 and 311 when VFB (scaled version of VOUT) is smaller than VREF, which is when VOUT falls to the point at which the HS transistor should be turned on to force VOUT up to maintain a regulated level (with a permitted amount of ripple due to the HS and LS transistors being reciprocally turned on and off).

In the example of FIG. 3, the pulse width of negative pulse 301 is larger than the pulse width of negative pulse 311, so PW1 is larger than PW2. At 302, LOOPRAW is high, which causes NMOS M3 to be on and PMOS M2 to be off. With M3 on, INV_IN is pulled low via M3 as shown at 322, and thus LOOPRAW_DLY (output of inverter 210) is logic high as shown at 332. When LOOPRAW falls to logic low at falling edge 303, M3 turns off and M2 turns on. At that point (M2 on and M3 off), the series connection of resistors R4 and R5 and capacitor C4 are connected between voltage AVDD and ground. INV_IN represents the voltage across capacitor C4. At 322, the capacitor voltage is 0V and the capacitor begins to charge responsive to M2 being turn on. As a result, INV_IN ramps up as shown at 323.

The rate at which INV_IN ramps up (the slope) is a function of the combined series resistance of R5 and R6 as well as the capacitance of C4. The charge current (I_C4) to capacitor C4 is AVDD/(R5+R6). The smaller is the sum of R5 and R6, the larger is the charge current I_C4 to capacitor C4. All else being equal, a smaller value of R5+R6 results in a larger value of I_C4 and thus a faster charge rate (slope of 323 is greater), and vice versa. Also, all else being equal, the charge rate is inversely related to the capacitance of C4. Accordingly, a smaller capacitance value of C4 results in a faster charge rate, and vice versa. Moreover, the rate of charge of capacitor C4 can be controlled by selection of the resistances of R5 and R6 and the capacitance of C4. While two resistors R5 and R6 are shown in series in the example of FIG. 3, in another example, a single resistor can be included, more than two resistors can be connected in series, or other series and/or parallel combinations of resistors can be included to obtain a desired effective resistance between the drain of M2 and capacitor C4. Similarly, series and/or parallel combinations of capacitors can be implemented in place of C4 to obtain a desired capacitance.

As INV_IN ramps at 323, when INV_IN exceeds the threshold voltage of inverter 210, the output signal LOOPRAW_DLY will change state from high to low. Thus, falling edge 333 of LOOPRAW_DLY occurs after falling edge 303 of LOOPRAW. The amount of time delay (DELAY) is a function the resistance R5+R6 and the capacitance of C4. In one implementation, the circuit components (R5, R6, and C4) are selected so that DELAY equals approximately 200 nanoseconds (ns).

LOOPRAW returns to its logic high level at rising edge 304. With LOOPRAW high, M2 turns off and M3 turns on. With M3 on, capacitor C4 discharges rapidly through M3 to ground, and thus INV_IN has a similar falling edge 324, and LOOPRAW_DLY has a corresponding rising edge 334. Thus, the falling edge 333 of LOOPRAW is delayed relative to the falling edge 303 of LOOPRAW, but the rising edge 334 of LOOPRAW_DLY is coincident with the rising edge 304 of LOOPRAW.

The right-hand side of FIG. 3 illustrates the operation of the delay circuit 160 when the width PW2 of a negative pulse 311 of LOOPRAW is smaller than the delay implemented by the delay circuit (e.g., 200 ns). INV_IN begins to ramp up at 327 as described above, but the width of the negative pulse 311 is small enough that the input voltage to inverter 210 (INV_IN) does not have a chance to exceed the inverter's threshold voltage. Accordingly, LOOPRAW_DLY does not experience a negative pulse.

Figure 4:
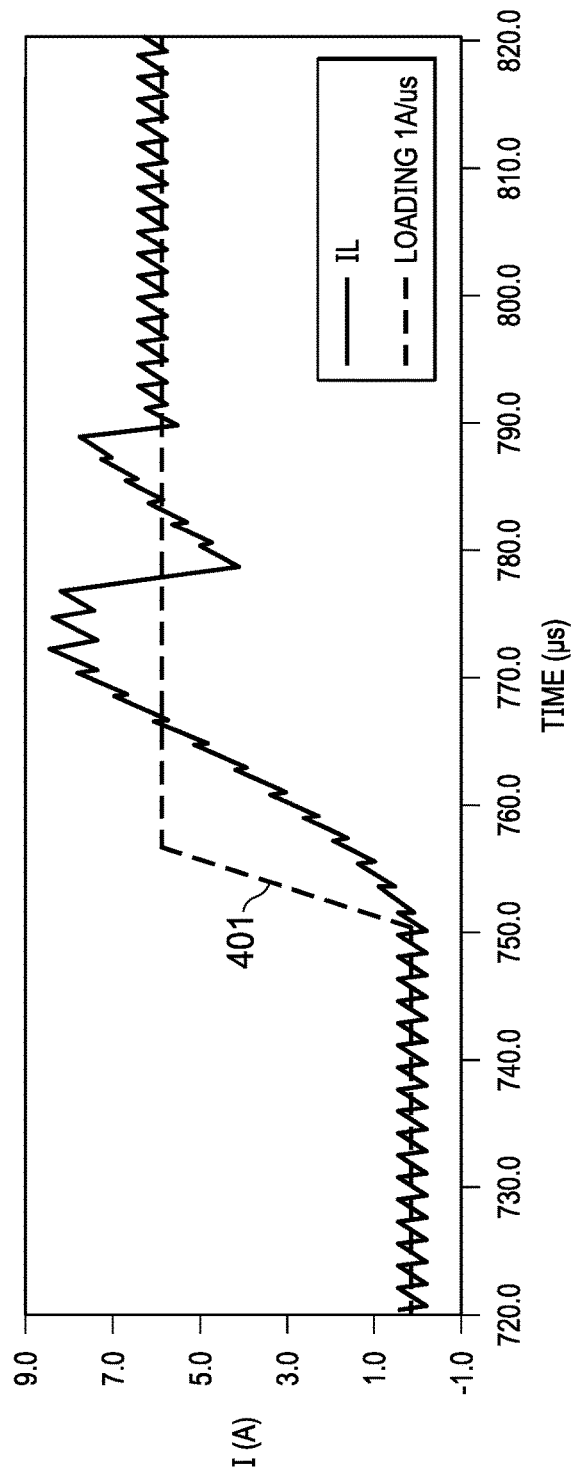
FIG. 4 illustrates output voltage undershoot of a voltage regulator.
Figure 4:
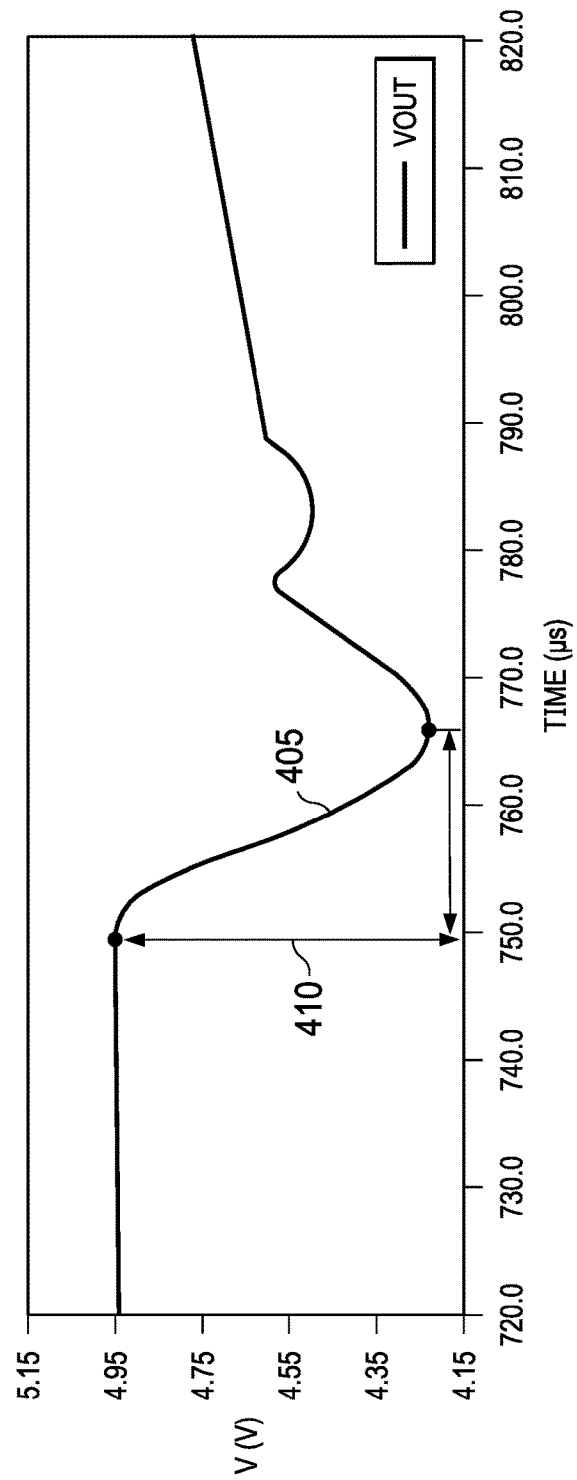

FIG. 4 illustrates a problem that can occur when there is a sudden change in load current while VIN is near VOUT. For example, VIN may normally be in the range of 7.4V to 8.4V but can drop below 7.4V as the battery that provides VIN to power the system in which voltage regulator 100 resides begins to completely discharge. For example, FIG. 4 illustrates the operation of the voltage regulator 100 (absent OTE circuit 165) for VOUT equal to 5V, VIN equal to 6V, and a sudden load current (IL) change as shown at 401. The load current increases, in this example, from approximately 0 A to 6 A at a rate of approximately 1.2 A/microsecond. The ripples shown for IL reflect the linear increases in IL as the HS transistor is turned on each cycle. The period of time that the HS transistor is on in each cycle is constant (again, absent the use of OTE circuit 165). VOUT is regulated by controlling the period of time that the HS transistor is off. Accordingly, logic 170 turns the HS transistor on for a fixed amount of time and then off for a variable amount of time so as to maintain VOUT at a target voltage level (e.g., 5V).

Figure 5:
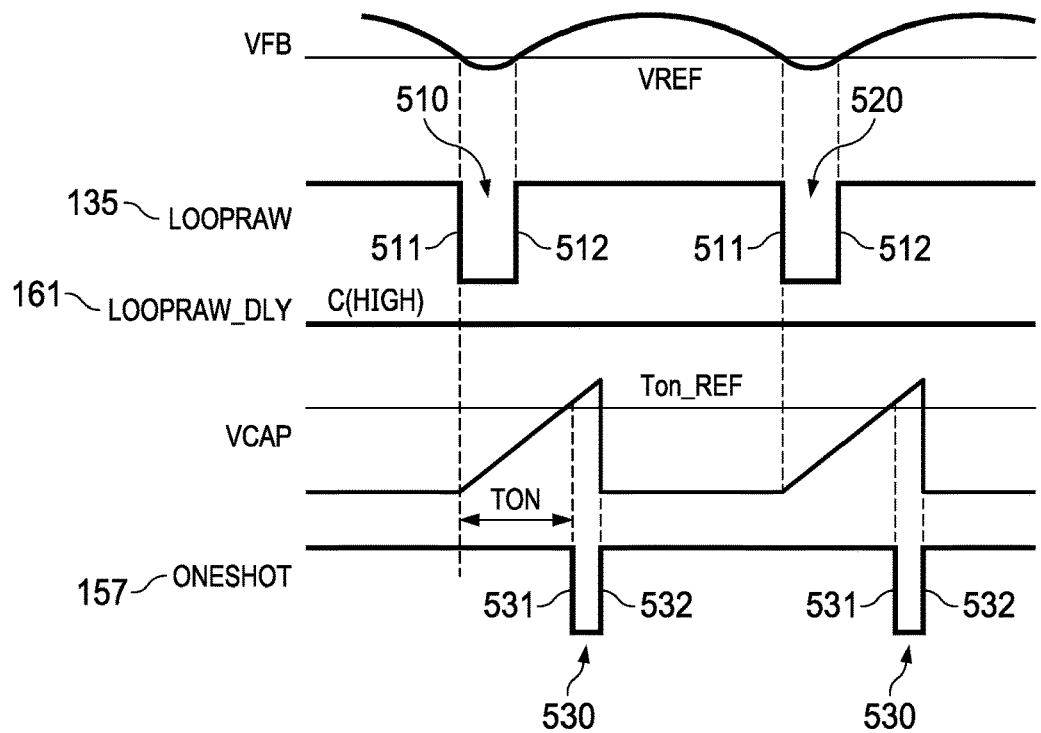
FIGS. 5 and 6 show timing diagrams illustrating the operation of the voltage regulator without on-time extension (FIG. 5) and with on-time extension (FIG. 6).

FIG. 4 shows that, with VIN being near VOUT, a sudden change in load current causes VOUT to experience a large undershoot at 405 before VOUT recovers back to its regulated output level. The peak magnitude of the undershoot is shown at 410. In this example, the undershoot peak at 410 is 740 mV. Such a drop in VOUT that large may be problematic to the correction operation of the load. The inclusion of the OTE circuit 165 helps to decrease the magnitude of the undershoot FIG. 5 illustrates the operation of the voltage regulator 100 including the OTE circuit 165 when there is no significant undershoot problem (as otherwise is shown in FIG. 4). The fluctuation in VFB relative to VREF is shown. While VFB is below VREF, LOOPRAW is logic low. Thus, LOOPRAW has negative pulses 510, which are defined by falling edges 511 and rising edges 512. The width of the negative pulses is equal to the period of time that LOOPRAW is below VREF. In this example, there is relatively little undershoot in VOUT (and thus VFB), and thus the negative pulses on LOOPRAW are relatively short in duration.

FIG. 5 also illustrates VCAP relative to TON_REF, the two signals provided to the inputs of comparator 155. VCAP ramps up as shown when the HS transistor is on. ONSHOT 157 is high when TON_REF is larger than VCAP, and low otherwise. Accordingly, ONSHOT 157 has negative pulses 530 (defined by falling edges 531 and rising edges 532) whose widths are equal to the time period in which VCAP is greater than TON_REF. The control inputs 171 and 173 of logic 170 receive ONSHOT 157 and LOOPRAW 135, respectively. Logic 170 controls the gate signal to the HS transistor to turn on the HS transistor upon occurrence of falling edges 511, and to turn off the HS transistor upon occurrence of falling edges 531 of ONSHOT 157. Logic 170 also asserts a control signal 172 (FIG. 1) to turn on M1 upon turning the HS transistor off to discharge capacitor C5 before the next on-cycle of the HS transistor starts. The on-time (TON) of the HS transistor (i.e., the period that the HS transistor is on in a cycle) is defined by the time period between each falling edge 511 of LOOPRAW and the subsequent falling edge 531 of ONESHOT.

LOOPRAW_DLY remains high during each cycle because the pulse width of each negative pulse 510 of LOOPRAW is too small for INV_IN to become high enough to reach the threshold voltage of inverter 210 as described above. Switch SW1 in FIG. 1 is on during each cycle because LOOPRAW_DLY remains high. With switch SW1 on, resistor RF2 is bypassed and the charge current to capacitor CF is larger than would be the case if switch SW1 were off and the charge current would also have to flow through resistor RF2.

Figure 6:
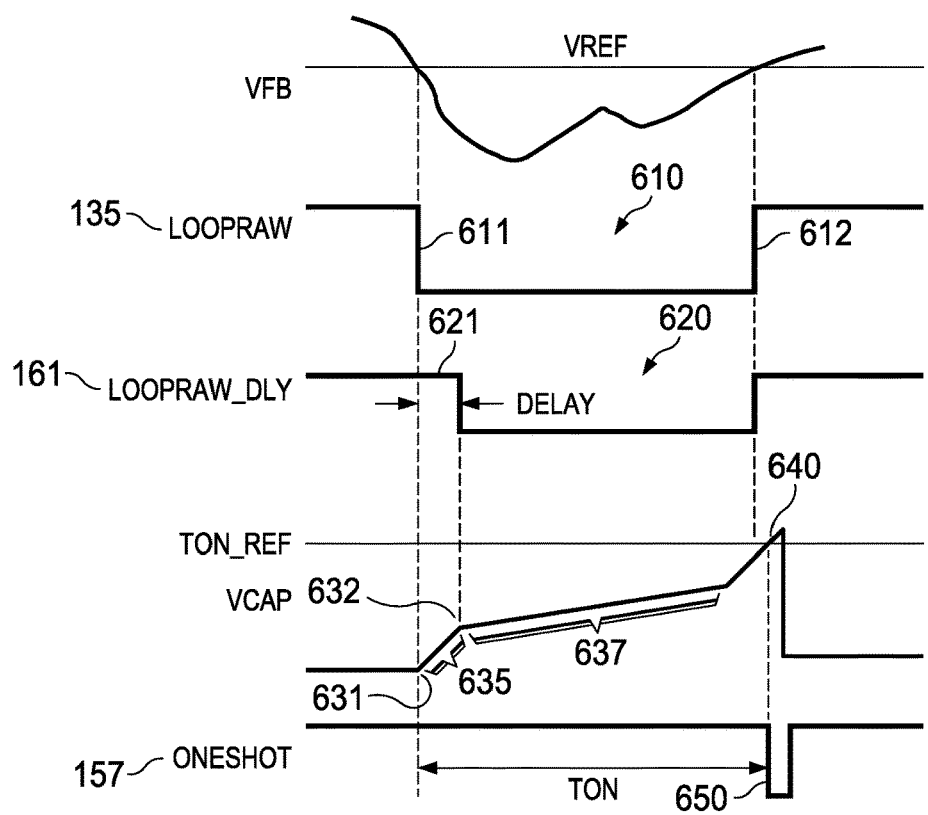

FIG. 6 illustrates the operation of the voltage regulator 100 when there is a significant undershoot problem. The pulse width of negative pulse 610 (defined by falling edge 611 and rising edge 612) of LOOPRAW is larger than that shown in FIG. 5 because VFB remains below VREF for a longer period of time. The width of the negative pulse 610 is large enough so as to allow VCAP to ramp up to at least the threshold voltage of inverter 210 to thereby trigger a negative pulse for LOOPRAW_DLY. Starting at 631, VCAP begins to ramp up at a first rate during 635 with switch SW1 being closed thereby bypassing resistor RF2. At 632, the falling edge 621 of the LOOPRAW_DLY negative pulse 620 initiates a period of time in which LOOPRAW_DLY is logic low, which causes switch SW1 to turn off (open). With switch SW1 being off, charge current flows through resistor RF2 as well as RF1. As a result of the extra resistance of RF2 created by opening switch SW1, the magnitude of the charge current to capacitor CF decreases and thus the rate at which capacitor CF charges decreases as shown at 637. By decreasing the charge rate on capacitor CF, additional time is required for VCAP to reach TON_REF (compared to FIG. 5). When VCAP eventually reaches TON_REF at 640, a falling edge 650 occurs on ONESHOT 157. Logic 170 responds to the falling edge 611 of LOOPRAW 135 by turning on the HS transistor and responds to the falling edge 650 on ONESHOT 650 by turning off the HS transistor.

The on-time of the HS transistor in the timing example of FIG. 6 has been extended and is greater than the on-time of FIG. 5. Accordingly, due to the larger output voltage undershoot, the width of the negative pulse on LOOPRAW increases, which provides enough time for LOOPRAW_DLY to be asserted low, which in turn causes the charge current to capacitor CF to decrease, thereby extending the time point at which ONESHOT 157 transitions to a logic low level.

Figure 7:
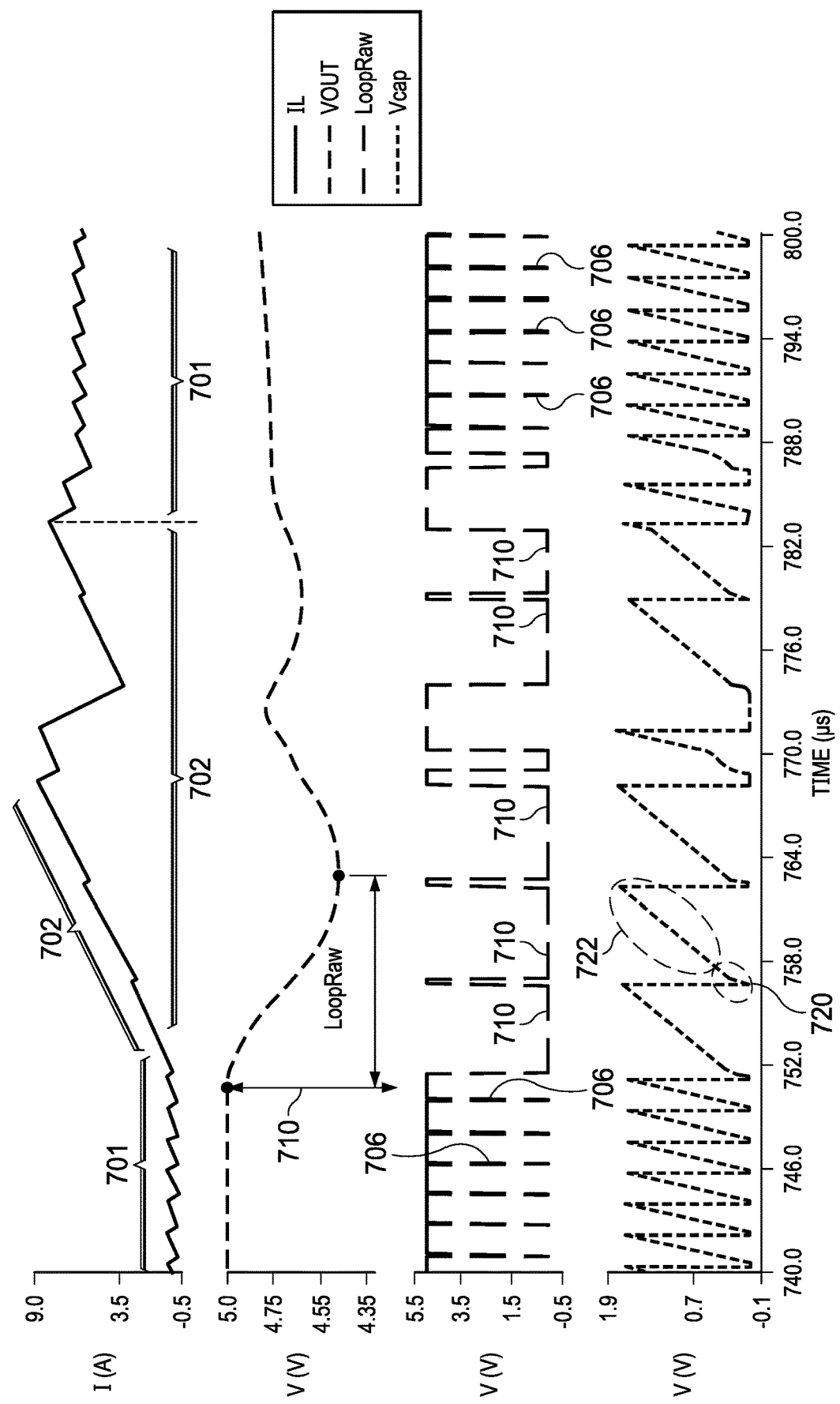
FIG. 7 illustrates a reduction in output voltage undershoot of the voltage regulator of FIG. 1.

FIG. 7 illustrates a sudden increase in load current when VIN is near VOUT (e.g., Vin=6V and VOUT=5V). As shown in FIG. 7, the time period of each cycle is larger at 702 than at 701, because that the on-time of the HS transistor has been extended during the undershoot portion 702. At 720, VCAP ramps up at faster rate than at 722. The slower rate at 722 is due to switch SW1 being turned off to decrease the charge current to the capacitor CF as described above. The width of the negative pulses 710 are larger during the undershoot portion 702 compared to the narrow negative pulses 706 that occur with no significant output voltage undershoot. Advantageously, the peak undershoot 710 in FIG. 7 is shown as 480 mV (lower than the 740 mV of FIG. 4). Further, with HS transistor on-time being extended, the duty cycle of the HS transistor during the undershoot portion is larger (e.g., 95%) than the duty cycle of the HS transistor as illustrated in FIG. 4 (e.g., 88%).

Figure 8:
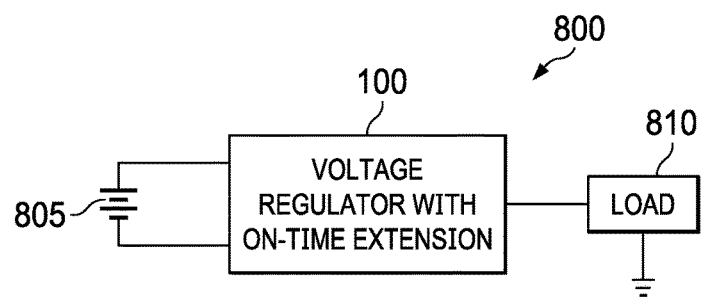
FIG. 8 illustrates a system in which the voltage regulator of FIG. 1 can be used.

FIG. 8 shows a system 800 comprising a battery 805, voltage regulator 100 (with on-time extension), and a load 810. In one example, the system 800 is a notebook computer and the load includes one or more of the computer's processor, memory, and other electronics.

The term "couple" is used throughout the specification. The term may cover connections, communications, or signal paths that enable a functional relationship consistent with this description. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Modifications are possible in the described embodiments, and other embodiments are possible, within the scope of the claims.

What is claimed is:

1. A voltage regulator circuit, comprising:
    a high side (HS) transistor having a control input;
    a low side (LS) transistor having a control input, the LS transistor is coupled to the HS transistor at a switching terminal;
    a comparator having first and second inputs and an output;
    a first resistor coupled to the switching terminal;
    a second resistor coupled between the first resistor and the second input of the comparator, the second resistor having first and second resistor terminals;
    a capacitor coupled between the second resistor terminal and a ground;
    a switch having first and second switch terminals and a control input, the first switch terminal is coupled to the first resistor terminal, and the second switch terminal is coupled to the second resistor terminal; and
    a delay circuit having an input and an output, the output of the delay circuit is coupled to the control input of the switch.

2. The voltage regulator circuit of claim 1, wherein the delay circuit is configured to generate a falling edge on its output responsive to a signal on its input being logic low for more than a delay time period after a falling edge of a signal on the input of the delay circuit.

3. The voltage regulator circuit of claim 2, wherein the switch is configured to be open responsive to a logic low on the output of the delay circuit, and the switch is configured to be closed responsive to a logic high on the output of the delay circuit.

4. The voltage regulator circuit of claim 3, wherein, the capacitor is configured to be charged from a charge current through the first resistor responsive to a voltage on the switching terminal, and wherein a magnitude of the charge current is lower responsive to the switch being open than the switch being closed.

5. The voltage regulator circuit of claim 1, wherein the capacitor is a first capacitor, and the delay circuit comprises:
    a first transistor;
    a second transistor;
    a resistor coupled between the first and second transistors; and
    a second capacitor coupled across the second transistor.

6. The voltage regulator circuit of claim 5, wherein the first transistor has a control input, the second transistor has a control input, and the control inputs of the first and second transistors are coupled together.

7. The voltage regulator circuit of claim 1, wherein the comparator is a first comparator, and the voltage regulator circuit further comprises a second comparator, the second comparator having first and second inputs and an output, the first input of the second comparator coupled to an output of the voltage regulator circuit, the second input of the second comparator coupled to a reference voltage terminal, and the output of the second comparator coupled to input of the delay circuit.

8. The voltage regulator circuit of claim 7, wherein the delay circuit is configured to:
    responsive to a width of a pulse on the input of the delay circuit being greater than a threshold, generate a pulse on the output of the delay circuit; and
    responsive to the width of the pulse on the input of the delay circuit being less than the threshold, cease generating the pulse on the output of the delay circuit.

9. A voltage regulator circuit, comprising:
    a high side (HS) transistor having a control input;
    a low side (LS) transistor having a control input, the LS transistor is coupled to the HS transistor at a switching terminal;
    a comparator having a first input, a second input and an output;
    a logic circuit having a first and second control inputs and first and second outputs, the second input is coupled to the output of the comparator, the first output is coupled to the control input of the HS transistor and the second output is coupled to the control input of the LS transistor, the logic circuit is configured to turn on the HS transistor responsive to a signal edge on the output of the comparator; and
    a one-shot circuit having an input and an output, the input of the one-shot circuit is coupled to the output of the comparator, and the output of the one-shot circuit is coupled to the first control input of the logic circuit, the one-shot circuit is configured to generate a signal edge on its output at a time period after a signal edge on the output of the comparator, the time period defining an on-time for the logic circuit to maintain the HS transistor in an on state, and the one-shot circuit is configured to lengthen the on-time responsive to a width of a pulse on the output of the comparator exceeding a threshold value;
    wherein the one-shot circuit includes:
        a first resistor coupled to the switching terminal;
        a capacitor;
        a second resistor coupled between the first resistor and the capacitor, the second resistor having first and second resistor terminals;
        a switch having first and second switch terminals and a control input, the first switch terminal is coupled to the first resistor terminal, and the second switch terminal is coupled to the second resistor terminal; and
        a delay circuit having an input and an output, the input of the delay circuit is coupled to the output of the comparator, and the output of the delay circuit is coupled to the control input of the switch.

10. The voltage regulator circuit of claim 9, wherein the comparator is a first comparator, and wherein the one-shot circuit includes:
    a second comparator having first and second inputs and an output, one of the first and second inputs coupled to the second resistor terminal and the output of the comparator is coupled to the first control input of the logic circuit.

11. The voltage regulator circuit of claim 9, wherein the one-shot circuit includes a delay circuit having an input and an output, the delay circuit is configured to generate a falling edge on its output responsive to a signal on its input being logic low for more than a delay time period after a falling edge of a signal on the input of the delay circuit.

12. The voltage regulator circuit of claim 11, wherein a logic low on the output of the delay circuit causes the switch to be open, and a logic high on the output of the delay circuit causes the switch to be closed.

13. The voltage regulator circuit of claim 12, wherein, responsive to a voltage on the switching terminal, a charge current through the first resistor is caused to flow to charge the capacitor, and wherein a magnitude of the charge current is lower responsive to the switch being open than the switch being closed.

14. The voltage regulator circuit of claim 9, wherein the one-shot circuit comprises:
 a first transistor having a control input;
 a second transistor having a control input;
 a resistor coupled between the first and second transistors; and
 a capacitor coupled across the second transistor;
 wherein the control inputs of the first and second transistors are coupled together.

15. The voltage regulator circuit of claim 14, wherein the resistor is a first resistor, and wherein the one-shot circuit comprises:
 a second resistor;
 a switch coupled across the second resistor, the switch having a control input; and
 inverter having an input and an output, the input of the inverter is coupled to the second resistor and to the second transistor, and the output of the inverter is coupled to the control input of the switch.

16. A system, comprising:
 a load; and
 a voltage regulator having an input voltage terminal and an output voltage terminal, the output voltage terminal is coupled to the load, the voltage regulator includes a high side (HS) transistor coupled to a low side (LS) transistor at a switching terminal, the voltage regulator also includes a control circuit that is configured to:
  turn on the HS transistor for a on-time responsive to an amount of undershoot of an output voltage on the output voltage terminal being less than a threshold; and
  extend the on-time of the HS transistor responsive to the amount of undershoot being greater than the threshold,
 wherein the control circuit includes:
  a comparator having first and second inputs and an output;
  a first resistor coupled to the switching terminal;
  a second resistor coupled between the first resistor and the second input of the comparator, the second resistor having first and second resistor terminals;
  a capacitor coupled between the second resistor terminal and a ground;
  a switch having first and second switch terminals and a control input, the first switch terminal is coupled to the first resistor terminal, and the second switch terminal is coupled to the second resistor terminal; and
  a delay circuit having an input and an output, the output of the delay circuit is coupled to the control input of the switch.

17. The system of claim 16, wherein the delay circuit is configured to:
 responsive to a width of a pulse on the input of the delay circuit being greater than a threshold, generate a pulse on the output of the delay circuit; and
 responsive to the width of the pulse on the input of the delay circuit being less than the threshold, not generate the pulse on the output of the delay circuit.

18. The system of claim 16, wherein the control circuit is configured to extend the on-time of the HS transistor by charging a capacitor with a first current magnitude and charging the capacitor with a second current magnitude, the second current magnitude being smaller than the first current magnitude.

* * * * *